(12) United States Patent
Xu et al.

(10) Patent No.: US 9,416,002 B2
(45) Date of Patent: Aug. 16, 2016

(54) PACKAGED SEMICONDUCTOR SENSOR DEVICE WITH LID

(71) Applicants: Nan Xu, Tianjin (CN); Xingshou Pang, Tianjin (CN); Xuesong Xu, Tianjin (CN)

(72) Inventors: Nan Xu, Tianjin (CN); Xingshou Pang, Tianjin (CN); Xuesong Xu, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/559,921

(22) Filed: Dec. 4, 2014

(65) Prior Publication Data
US 2016/0023894 A1    Jan. 28, 2016

(30) Foreign Application Priority Data

Jul. 28, 2014 (CN) .......................... 2014 1 0520628

(51) Int. Cl.
*H01L 29/84* (2006.01)
*B81C 1/00* (2006.01)
*B81B 7/00* (2006.01)

(52) U.S. Cl.
CPC ........... *B81C 1/00269* (2013.01); *B81B 7/0058* (2013.01); *B81B 2201/0264* (2013.01)

(58) Field of Classification Search
CPC ....................................................... H01L 29/84
USPC ........................................................ 257/723
See application file for complete search history.

(56) References Cited

U.S. PATENT DOCUMENTS

| 5,200,367 | A  | * | 4/1993  | Ko .................................. 29/827 |
| 5,444,286 | A  | * | 8/1995  | Ichihashi ............ G01L 19/0084 257/420 |
| 7,033,866 | B2 |   | 4/2006  | Chow |
| 7,437,951 | B2 |   | 10/2008 | McDonald |
| 7,762,141 | B2 |   | 7/2010  | Tanaka |
| 7,900,521 | B2 |   | 3/2011  | Hooper |
| 8,298,871 | B2 |   | 10/2012 | Wong |
| 8,359,927 | B2 |   | 1/2013  | Hooper |
| 2010/0300207 | A1 | * | 12/2010 | Ding et al. ...................... 73/721 |

* cited by examiner

*Primary Examiner* — Marc Armand
(74) *Attorney, Agent, or Firm* — Charles E. Bergere

(57) ABSTRACT

A method for assembling a packaged semiconductor device includes mounting a pressure-sensing die onto a die paddle of a metal lead frame. A pressure-sensitive gel is dispensed into a recess of a lid, and the lead frame is mated with the lid such that the pressure-sensing die is immersed in the pressure-sensitive gel within the recess of the lid.

8 Claims, 6 Drawing Sheets

PACKAGED SEMICONDUCTOR SENSOR DEVICE WITH LID

BACKGROUND

The present invention relates generally to semiconductor sensor devices and more particularly to methods of assembling semiconductor pressure sensor devices.

Semiconductor sensor devices, such as pressure sensors, are well known. Such devices use semiconductor pressure-sensing dies to sense the ambient atmospheric pressure. These dies are susceptible to mechanical damage during packaging and environmental damage when in use, and thus they must be carefully packaged. Further, pressure-sensing dies, such as piezo resistive transducers (PRTs) and parameterized layout cells (P-cells), do not allow full encapsulation because that would impede their functionality.

FIG. 1 shows a cross-sectional side view of a conventional packaged semiconductor sensor device 100. The semiconductor sensor device 100 has a pre-molded lead frame 102 comprising a metal die paddle 104 (also known as a lead frame flag), a plurality of metal lead fingers 106 that surround the die paddle 104, and molding compound 108. The molding compound 108 (i) fills areas between adjacent ones of the lead fingers 106 and between the lead fingers 106 and the die paddle 104, and (ii) forms a cavity 110 over the die paddle 104.

A P-cell 112 and a micro-control unit die (MCU) 114 are mounted on the die paddle 104 using a die-attach adhesive 116. The P-cell 112 and MCU 114 are electrically connected to one another and to the lead fingers 106 with bond wires 118. The P-cell 112 and MCU 114 then are encapsulated in a pressure-sensitive gel material 120, which enables the pressure of the ambient atmosphere to reach the pressure-sensing active region on the top side of the P-cell 112, while protecting the dies 112 and 114 and the bond wires 118 from mechanical damage during packaging and environmental damage (e.g., contamination and/or corrosion) when in use. The lead frame cavity 110 is covered by a lid 122, which has a vent hole 124 formed therethrough to expose the gel-covered P-cell 112 to ambient atmospheric pressure outside the sensor device 100.

One problem with the sensor device 100 is the high manufacturing cost due to the use of a pre-molded lead frame 102. Accordingly, it would be desirable to be able to assemble a pressure sensor device without the need for a pre-molded lead frame.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the present invention.

In the following description, it will be understood that certain embodiments of the present invention are related to the packaging of packaged semiconductor sensor devices, wherein pressure-sensing dies mounted on lead frames are encapsulated in pressure-sensitive gel material using lids. For ease of discussion, the assembly of two exemplary packaged semiconductor sensor devices having specific lead frame and lid configurations is described below. However, it will be understood that embodiments of the present invention are not limited to the particular lead frame and/or lid configurations described below.

One embodiment of the present invention is a method for assembling a packaged semiconductor device. The method comprises (a) mounting a pressure-sensing die onto a die paddle of a metal lead frame, (b) dispensing a pressure-sensitive gel into a recess of a lid, and (c) mating the metal lead frame with the lid such that the pressure-sensing die is immersed in the pressure-sensitive gel within the recess of the lid. Another embodiment of the present invention is a packaged semiconductor device assembled in accordance with the method.

Figure 1:
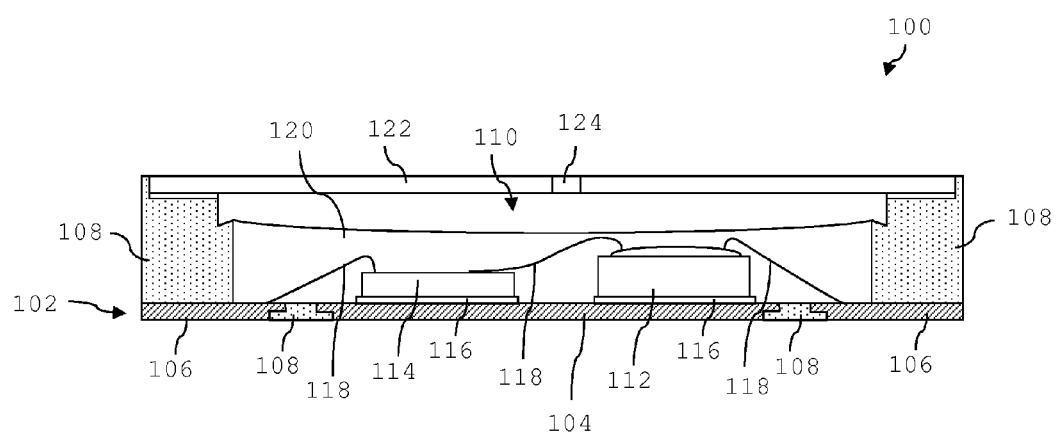
FIG. 1 shows a cross-sectional side view of a conventional packaged semiconductor sensor device.
Figure 2:
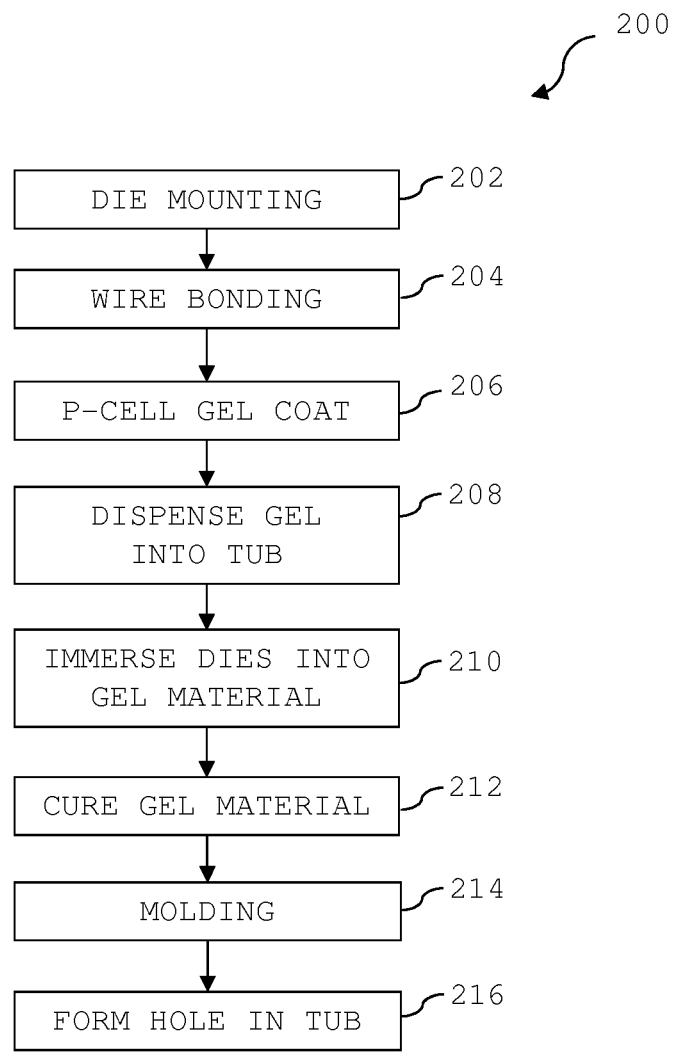
FIG. 2 is a simplified flow chart of a process for assembling a packaged semiconductor device according to one embodiment of the present invention.

FIG. 2 shows a simplified flow diagram 200 of a process for assembling a packaged semiconductor device according to one embodiment of the present invention. In step 202, one or more integrated circuit (IC) dies, including a pressure-sensing die (e.g., P-cell), are mounted onto a die paddle (also known as a lead frame flag) of a metal lead frame using a die-attach adhesive. In step 204, the one or more IC dies are wire bonded to one another and to lead fingers of the metal lead frame. In step 206, pressure-sensitive gel material is dispensed onto the active region of the pressure-sensing die.

Figure 3A:
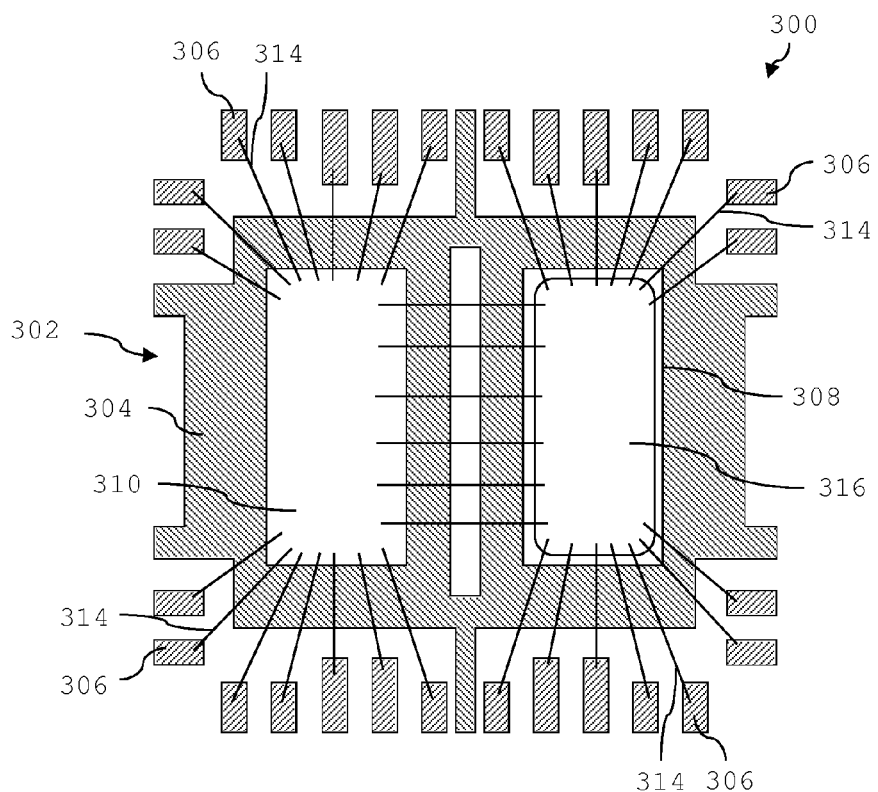
FIGS. 3A and 3B show top and side views, respectively, of a sub-assembly according to one embodiment of the present invention that is assembled in accordance with steps 202-206 of FIG. 2.
Figure 3B:
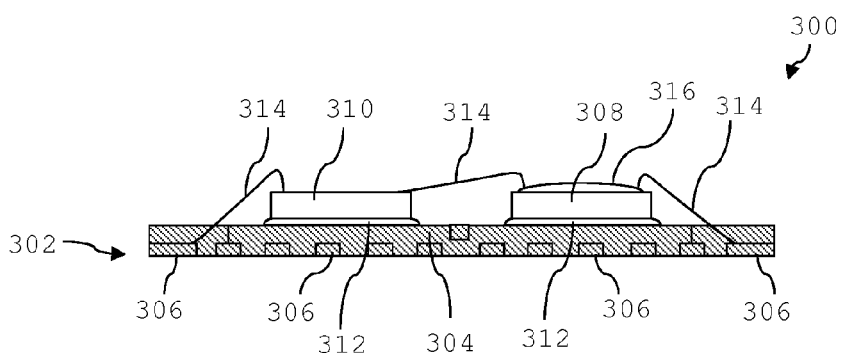

FIGS. 3A and 3B show top and side views, respectively, of a sub-assembly 300 according to one embodiment of the present invention that is assembled in accordance with steps 202-206 of FIG. 2. Sub-assembly 300 comprises a metal lead frame 302, a P-cell 308, and a micro-control unit die (MCU) 310. Sub-assembly 300 may also comprise an acceleration sensing die (not shown) mounted on, for example, the MCU 310. Methods of fabricating the lead frame 302, the P-cell 308, and the MCU 310 are well known and therefore not described herein.

The metal lead frame 302 comprises a die paddle 304 and a plurality of lead fingers 306. Although not shown, the metal lead frame 302 may comprise metal connecting elements (sometimes referred to as lead frame runners) that connect the distal ends of the lead fingers 106 to one another. These metal connecting elements may also connect the lead frame 302 to one or more other instances (not shown) of the lead frame 302 such that the instances of lead frames form an array of interconnected lead frames.

The P-cell 308 and the MCU 310 are mounted onto the die paddle 304 using a die-attach adhesive 312, such as (without limitation) an epoxy or tape. The P-cell 308 and MCU 310 are electrically connected to one another and to the lead fingers 306 via a plurality of bond wires 314. Further, a pressure-sensitive gel material 316 is dispensed onto the active region of the P-cell 308 using, for example, the nozzle of a conventional dispensing machine (not shown).

Referring back to FIG. 2, in steps 208-216, the sub-assembly assembled in steps 202-206 is mated with a lid, and assembly of the packaged semiconductor device is completed. To further understand this mating process, consider FIGS. 4A, 4B, 5, and 6 along with FIG. 2.

Figure 4A:
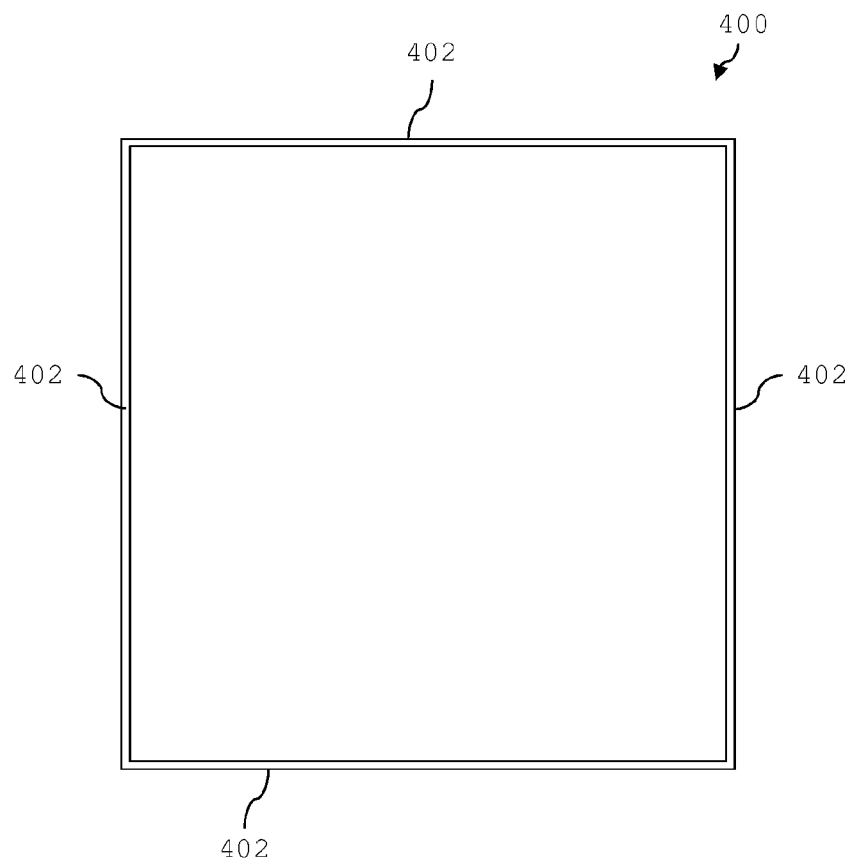
FIGS. 4A and 4B show top and cross-sectional side views, respectively, of a lid according to one embodiment of the present invention.
Figure 4B:
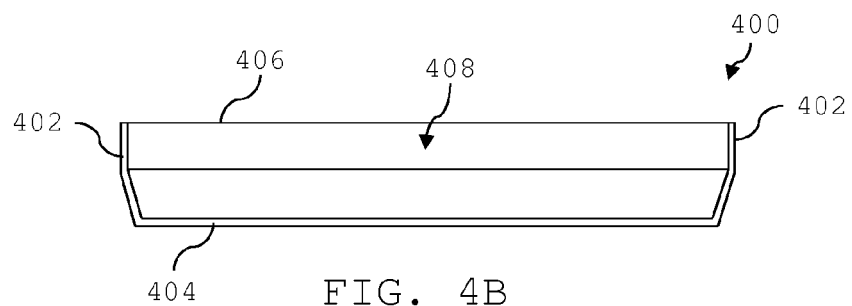

FIGS. 4A and 4B show top and cross-sectional side views, respectively, of a lid 400 according to one embodiment of the present invention. In this embodiment, the lid 400 is a unitary structure fabricated from a single piece of material. The lid 400 comprises four outer walls 402 that form a closed shape (in this embodiment, a rectangle). The bottom of the lid 400 is closed by another wall 404, and the top 406 of the rectangle is open. The walls 402 and 404 define a cavity or recess 408 formed within the lid 400.

Figure 5:
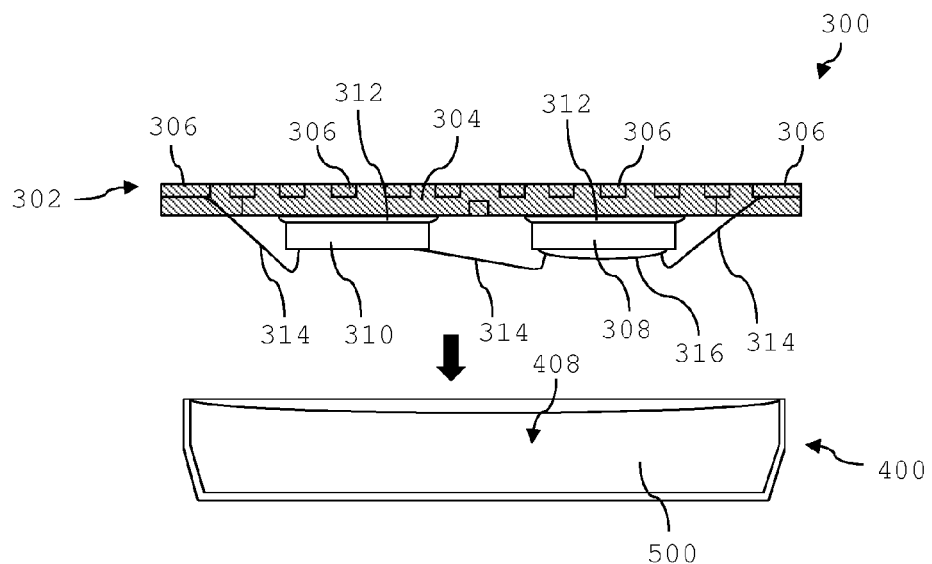
FIG. 5 shows a cross-sectional side view of the sub-assembly of FIGS. 3A and 3B being mated with the lid of FIGS. 4A and 4B.

FIG. 5 shows a cross-sectional side view of the sub-assembly 300 of FIGS. 3A and 3B being mated with the lid 400 of FIGS. 4A and 4B. As shown, pressure-sensitive gel material 500 is dispensed into the recess 408 of the lid 400 (step 208 of FIG. 2), using, for example, the nozzle of a conventional dispensing machine (not shown). The sub-assembly 300 comprising the lead frame 302, the P-cell 308, and the MCU 310 is flipped upside down, and lowered onto the lid 400 such that the P-cell 308 and MCU 310 are immersed in the pressure-sensitive gel material 500 (step 210). The pressure-sensitive gel material 500 is subsequently cured (step 212), and as a result, the cured pressure-sensitive gel material 500 secures the lid 400 to the sub-assembly 300.

Figure 6:
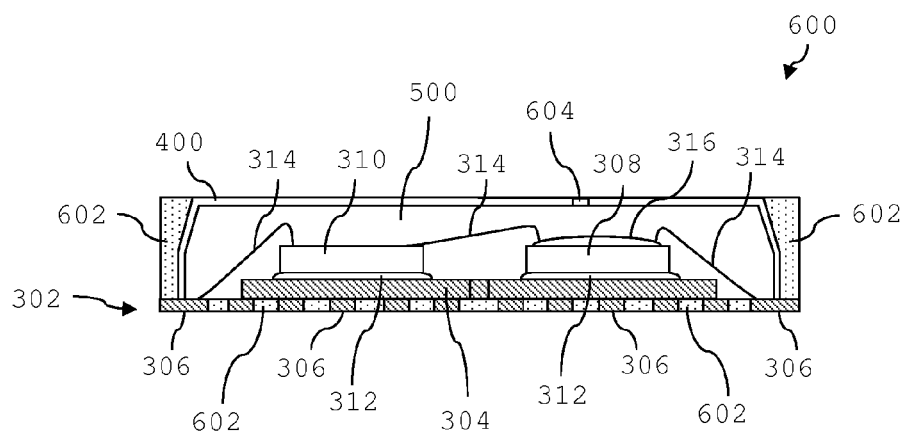
FIG. 6 shows a cross-sectional side view of a completed packaged semiconductor device according to one embodiment of the present invention.

FIG. 6 shows a cross-sectional side view of a completed packaged semiconductor sensor device 600 according to one embodiment of the present invention. As shown, the exposed portions of the lead frame and the sides of the lid 400 are encased in a molding compound 602 (step 214), and in step 216, a hole 604 is formed in the lid such as by punching or drilling the hole or by removing tape covering a pre-formed hole to expose the pressure-sensitive gel material 500 to the ambient environment outside of the packaged semiconductor sensor device 600.

Although not shown, laser or saw singulation and/or trimming may be performed to remove any metal connecting elements (not shown) to (i) electrically and mechanically de-couple the lead fingers 306 from one another and (ii) separate the packaged semiconductor device 600 from other packaged semiconductor devices assembled on adjacent, interconnected lead frames (not shown).

Although an embodiment of the present invention was described in which a sub-assembly 300 and lid 400 are held together during assembly using only cured pressure-sensitive gel material 500, embodiments of the present invention are not so limited. According to alternative embodiments, the sub-assembly and lid may be held together during assembly using tape. As an example, consider FIGS. 7A, 7B, and 8.

Figure 7A:
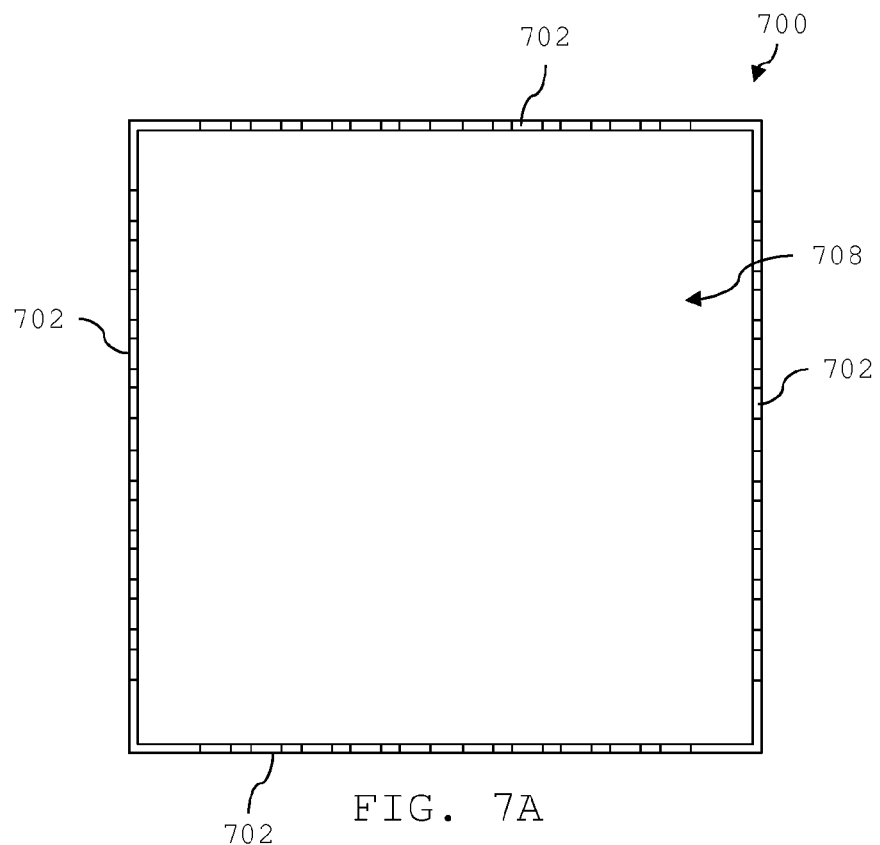
FIGS. 7A and 7B show top and side views, respectively, of a lid according to another embodiment of the present invention.
Figure 7B:
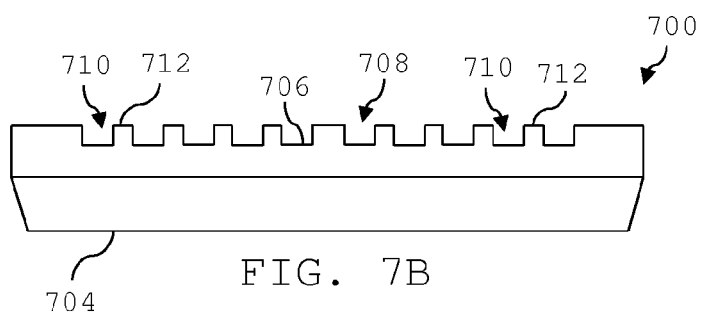

FIGS. 7A and 7B show top and side views, respectively, of a lid 700 according to another embodiment of the present invention. Lid 700 has walls 702, bottom 704, open top 706, and recess 708, which are similar to the analogous components of lid 400 of FIGS. 4A and 4B. However, unlike wall 402, wall 702 has a plurality of cut-outs 710 formed therein that form a plurality of tabs 712. The plurality of tabs 712 are sized, shaped, and spaced to fit between the lead fingers of the lead frame on which the lid 700 is to be mounted. As an example, consider FIG. 8.

Figure 8:
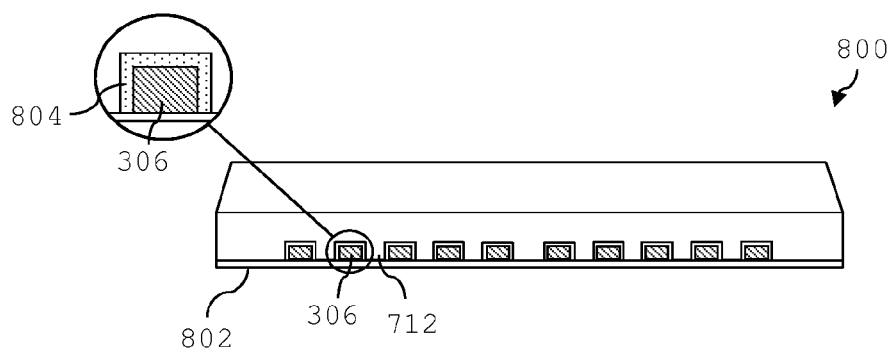
FIG. 8 shows a side view of a packaged semiconductor device according to another embodiment of the present invention.

FIG. 8 shows a side view of a packaged semiconductor device 800 according to another embodiment of the present invention. In this figure, the lid 700 is mated with the sub-assembly 300 of FIGS. 3A and 3B. As shown, the lead fingers 306 of the sub-assembly 300 extend into the cut-outs 710 of the lid 700, and the tabs 712 of the lid 700 extend between the lead fingers 306. As a result of this configuration, the sub-assembly 300 and lid 700 may be secured together during assembly using tape 802 that attaches to the bottoms of the lead frame 302 of the sub-assembly 300 and the tabs 712 of the lid 700.

Note that, in the embodiment of FIG. 8, the outer perimeter of the lid 700 has the same dimensions as the outer perimeter of the lead frame 302 such that no portion of the lead fingers 306 extends outside the perimeter of the lid 700. When the molding compound 804 is dispensed onto the packaged semiconductor device 800, the molding compound 804 encases the exposed portions of the lead frame (e.g., between adjacent lead fingers and between the lead fingers and the die paddle), but not the sides of the lid 700. Further, the molding compound 804 fills the remaining area of each cutout 710 that is not occupied by a lead finger 306.

In alternative embodiments of the present invention, the outer perimeter of the lid 700 may be sized smaller than the outer perimeter of the lead frame 302 such that portions of the lead fingers 306 extend outside the perimeter of the lid 700. In such embodiments, the molding compound may encase the sides of the lid 700 and the exposed portions of the lead fingers 306 in a manner similar to how the molding compound 602 encases the sides of the lid 400 and the exposed portions of the lead fingers 306 in FIG. 6.

In further alternative embodiments of the present invention, the outer perimeter of the lid 400 in FIG. 6 may be the same size as the outer perimeter of the lead frame 302, such that no portions of the lead fingers 306 extend outside the perimeter of the lid 400. In such embodiments, the molding compound may or may not encase the sides of the lid 400.

Lids of the present invention may be fabricated from metal, plastic, or any other suitable material. If, when installed, a lid will contact the lead fingers (e.g., as shown in FIG. 6), then it may be desirable to fabricate the lid from an electrically insulating material so that the lead fingers do not short one another. If, on the other hand, the lid will not contact the lead fingers (e.g., as shown in FIG. 8), then the lid may be fabricated from an electrically insulating or electrically conducting material.

According to alternative embodiments of the present invention, packaged semiconductor sensor devices may be implemented with lids having shapes other than those shown in the figures. For example, packaged semiconductor devices of the present invention may be implemented with lids that have a dome shape or any other suitable shape.

Although one embodiment of the present invention was described relative to its use with a lead frame having a particular configuration, embodiments of the present invention are not so limited. According to alternative embodiments, the present invention may be implemented with lead frames having configurations other than that shown.

In addition, alternative embodiments of the present invention may be implemented using flip-chip bonding, in lieu of, or in addition to, wire bonding.

According to alternative embodiments of the present invention, the pressure-sensing die may be mounted onto a lead frame in a stacked configuration with one or more intervening components (e.g., dies) between the pressure-sensing die and the lead frame. Thus, as used herein, the phrase "mounted on" contemplates that one or more intervening elements may be present. Conversely, the phrase "directly mounted on" implies the absence of such intervening elements.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Terms of orientation such as "lower," "upper," "horizontal," "vertical," "above," "below," "up," "down," "top," "bottom," "right," and "left" well as derivatives thereof (e.g., "horizontally," "vertically," etc.) should be construed to refer to the orientation as shown in the drawing under discussion. These terms of orientation are for convenience of description and do not require that the apparatus be constructed or operated in a particular orientation.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. A method for assembling a packaged semiconductor device, the method comprising:
   (a) mounting a pressure-sensing die on a die paddle of a metal lead frame to form a sub-assembly;
   (b) providing a lid with a recess facing up;
   (c) dispensing a pressure-sensitive gel into the recess of the lid; and
   (d) flipping over the sub-assembly and mating the sub-assembly with the lid such that the pressure-sensing die is immersed in the pressure-sensitive gel within the recess of the lid.

2. The method of claim 1, wherein:
   the lid comprises at least one outer wall comprising a plurality of tabs formed at a top edge thereof; and
   step (c) comprises positioning each tab between adjacent lead fingers of the lead frame.

3. The method of claim 1, wherein:
   the lid comprises at least one outer wall; and
   step (c) comprises abutting a top edge of the at least one outer wall against one or more lead fingers of the lead frame.

4. The method of claim 1, wherein step (c) comprises applying tape to the lead frame to secure the lead frame to the lid.

5. The method of claim 1, wherein the lid is a unitary structure.

6. A packaged semiconductor device assembled by the method of claim 1.

7. The method of claim 3, further comprising forming a molding compound at least partially around the lid.

8. The method of claim 7, further comprising punching a hole in the lid.

* * * * *